US012812763B2

(12) United States Patent
Rademacher et al.

(10) Patent No.: US 12,812,763 B2
(45) Date of Patent: Nov. 24, 2026

(54) THERMAL INTERFACE FOR ELECTRONIC CONTROL UNIT

(71) Applicant: Aptiv Technologies AG, Schaffhausen (CH)

(72) Inventors: Falk Rademacher, Gummersbach (DE); Peter Reinhold, Gummersbach (DE)

(73) Assignee: Aptiv Technologies AG, Schaffhausen (CH)

( * ) Notice: Subject to any disclaimer, the term of this patent is extended or adjusted under 35 U.S.C. 154(b) by 386 days.

(21) Appl. No.: 18/498,499

(22) Filed: Oct. 31, 2023

(65) Prior Publication Data

US 2024/0147601 A1 May 2, 2024

(30) Foreign Application Priority Data

Oct. 31, 2022 (EP) .................................... 22204695

(51) Int. Cl.
*H05K 1/02* (2006.01)
*H05K 7/20* (2006.01)

(52) U.S. Cl.
CPC ....... *H05K 1/0203* (2013.01); *H05K 7/20509* (2013.01); *H05K 2201/066* (2013.01)

(58) Field of Classification Search
CPC ............. H05K 7/2039; H05K 7/20409; H05K 7/20436; H05K 7/20472; H05K 7/2049; H05K 7/20509; H05K 7/20854; H05K 7/2089; H05K 5/0026; H05K 5/0047; H05K 5/0073; H05K 5/0217; H05K 1/0203–0204; H05K 1/144; H05K 2201/066; H05K 3/00; H05K 3/303; H05K 3/40; H05K 3/46; H05K 3/4638; H05K 9/0007; H05K 9/0022; H05K 9/0024;
(Continued)

(56) References Cited

U.S. PATENT DOCUMENTS

| | | | | |
|---|---|---|---|---|
| 7,245,896 B2 * | 7/2007 | Seo | ..................... | H05K 9/0028 363/16 |
| 9,646,910 B2 | 5/2017 | Ahuja et al. | | |

(Continued)

FOREIGN PATENT DOCUMENTS

| | | |
|---|---|---|
| EP | 2814057 A2 | 12/2014 |
| EP | 3270410 A1 | 1/2018 |

OTHER PUBLICATIONS

Extended European Search Report for European Patent Application No. 22204695.5 mailed Apr. 6, 2023 (8 pages).

*Primary Examiner* — Amir A Jalali
(74) *Attorney, Agent, or Firm* — Miller Johnson

(57) ABSTRACT

A method for manufacturing an electronic control unit includes providing a printed circuit board with at least one electric component attached thereon. The method includes arranging a lower layer of thermal interface material on top of the electric component and arranging an integrated heat spreader on top of the lower layer. The method includes determining the distance of the top surface of the integrated heat spreader perpendicular to the printed circuit board and arranging an upper layer of thermal interface material on the top surface of the integrated heat spreader. A layer thickness of the upper layer is selected based on the determined distance. The method includes arranging a heat sink with a contact surface such that the contact surface contacts the upper layer.

11 Claims, 4 Drawing Sheets

(58) Field of Classification Search
CPC ......... H05K 9/0032; G06F 1/20; G06F 1/206; H10W 40/13; H10W 40/20; H10W 40/226; H10W 40/231; H10W 40/237; H10W 40/242; H10W 72/07152
See application file for complete search history.

(56) References Cited

U.S. PATENT DOCUMENTS

| | | | | |
|---|---|---|---|---|
| 2004/0262372 | A1* | 12/2004 | Houle | B23K 1/0016<br>257/E23.09 |
| 2006/0285297 | A1* | 12/2006 | Conner | H01L 23/4006<br>257/E25.023 |
| 2013/0188319 | A1* | 7/2013 | Yamaguchi | H01L 21/4817<br>361/717 |
| 2016/0315030 | A1* | 10/2016 | Strader | H01L 23/3737 |
| 2019/0241435 | A1* | 8/2019 | Muramatsu | C01B 32/194 |
| 2019/0390926 | A1* | 12/2019 | Koyano | F28F 21/02 |
| 2020/0365522 | A1* | 11/2020 | Wang | H01L 23/427 |
| 2021/0020542 | A1* | 1/2021 | Kumura | H01L 23/433 |
| 2021/0029855 | A1* | 1/2021 | Yoon | H01L 23/42 |
| 2021/0068244 | A1* | 3/2021 | Jung | H05K 9/0032 |
| 2021/0136949 | A1* | 5/2021 | Lin | B32B 7/08 |
| 2022/0238412 | A1* | 7/2022 | Liu | F28F 1/12 |
| 2023/0223313 | A1* | 7/2023 | Lu | H01L 23/3735<br>165/185 |
| 2023/0290743 | A1* | 9/2023 | Xiong | H05K 1/0216 |
| 2024/0114662 | A1* | 4/2024 | Kim | C08K 7/06 |

* cited by examiner

THERMAL INTERFACE FOR ELECTRONIC CONTROL UNIT

CROSS-REFERENCE TO RELATED APPLICATIONS

This application claims priority to EP App. No. 22 204 695 filed on Oct. 31, 2022, the entire disclosure of which is incorporated by reference.

FIELD

The present disclosure relates to a method for manufacturing an electronic control unit, a method for manufacturing multiple electronic control units, and an electronic control unit.

BACKGROUND

An electronic control unit, also known as an ECU, is an embedded system in automotive electronics that controls one or more of the electrical systems and/or subsystems in a car or any other vehicle. A reliable operation of electronic control units is critical for the safety and/or the functionality of the vehicle. This is especially true for electrically driven vehicles. Accordingly, this topic is becoming increasingly important.

Usually, an ECU comprises at least one electric component. Thereby most utilized electric components generate thermal energy. Some electric components generate thermal energy to an extent that external cooling is required. If this thermal energy is not dissipated, it may cause defects to develop on their own. Hence, an uncooled or insufficiently cooled electric component, such as an integrated circuit, can be damaged and/or shut itself down. Accordingly, a sufficient and reliable cooling must be provided for electric components which generate a certain amount of thermal energy.

A general solution used in practice for cooling an electric component of an ECU is the use of a heat sink thermally connected to the electric component. The heat sink may comprise cooling ribs and/or flow channels for guiding a cooling medium such as air, oil, and/or water. Regularly, the heat sink is not directly thermally connected to the electric component. Rather, a heat spreader is connected to the electric component, and the heat sink is stacked on top of the heat spreader. In the following two particular solutions based on the described general solution are described together with their drawbacks.

According to a first particular solution an ECU comprises a housing with an integrally formed heat spreader being a protrusion directing to the inside of the housing and towards a top surface of an electric component which is attached to a printed circuit board (PCB). Accordingly, a heat sink is contacted with an outside surface of the housing. To enable a transfer of thermal energy from the electric component to the integrally formed heat spreader, a layer of thermal interface material, also known as TIM, is arranged in a gap between the electric component and the heat spreader.

The first particular solution has the disadvantage that the gap has relatively high tolerances compared to the thickness and/or compressibility of common thermal interface materials. This is as several individual tolerances contribute to the tolerance of the gap. Tolerances of the electric component on the PCB, of the heat spreader/housing, and/or of the PCB. Since the transfer of thermal energy is highly dependent on the gap size and the related compression of the layer of thermal interface material, it is hardly possible to provide a predictable cooling performance for the electric component. Moreover, the high tolerances entail the risk that for a very small gap, the TIM is compressed to such an extent that the electric component is damaged.

According to a second particular solution, which is suggested by US 2016/155682 A1, an ECU is provided which allows a separate and individually dimensioned heat spreader to be arranged between an electric component and a heat sink. Therefor an opening into which the heat spreader can be inserted is provided in a housing of the ECU. The individually dimensioned heat spreader is selected after a measurement such that manufacturing tolerances are at least partially compensated. Hence, gaps which need to be filled with thermal interface material, e.g., between the electric component and the heat spreader and/or between the heat spreader and the heat sink, can be provided with relatively small tolerances. Thus, the drawbacks of the first particular solution may be partially overcome.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

However, the provision of individually dimensioned heat spreaders according to the second particular solution involves considerable manufacturing efforts. This is as the heat spreaders, which are regularly metal blocks, must be individually milled, which per se leads to high manufacturing efforts.

Thus, it is an object of the present disclosure to provide a method for manufacturing an electronic control unit, a method for manufacturing multiple electronic control units, and an electronic control unit that overcome the aforementioned drawbacks at least partially.

This object is achieved, at least partly, by a method for manufacturing an electronic control unit, a method for manufacturing multiple electronic control units, and an electronic control unit, as defined in the independent claims. Further aspects of the present disclosure are defined in the dependent claims.

In particular, the object is achieved by a method for manufacturing an electronic control unit. The method comprises the following steps in the given order: (A) providing a printed circuit board with at least one electric component attached thereon; (B) arranging a lower layer of thermal interface material on top of the electric component; (C) arranging an integrated heat spreader on top of the lower layer; (D) determining the distance of the top surface of the integrated heat spreader perpendicular to the printed circuit board; (E) arranging an upper layer of thermal interface material on the top surface of the integrated heat spreader, wherein a layer thickness of the upper layer is selected based on the determined distance, and arranging a heat sink with a contact surface such that the contact surface contacts the upper layer.

The at least one electric component may comprise an electronic component such as an integrated circuit.

Further, thermal interface material, which may be also referred to as TIM, can be any material that may be inserted between two components to enhance the thermal coupling between them. The thermal interface material may comprise a thermal paste, a thermal adhesive, a thermal gap filler, a thermally conductive pad, a thermal tape, a phase-change material (PCM), and/or a metal thermal interface material. Additional options for thermal interface material are described throughout the present disclosure.

The lower layer is optionally chosen to be relatively thin compared to the upper layer. Thus, heat from the electric component may transfer easily into the heat spreader. Hence, the heat spreader can already provide a certain buffer function for heat dissipation.

Further, the integrated heat spreader may serve to transfer heat energy from the hotter electric component to the colder heat sink. The integrated heat spreader may comprise a plate or a block of a material having high thermal conductivity. Respective materials are described throughout the following.

Moreover, the distance of the top surface of the integrated heat spreader perpendicular to the printed circuit board may be determined directly and/or indirectly. A height difference between the top surface of the integrated heat spreader and a top surface of the printed circuit board may be measured. Further, a height difference between the top surface of the integrated heat spreader and a top surface of another element attached to the printed circuit board may be measured.

That the layer thickness of the upper layer is selected based on the determined distance may refer to the aspect that for a greater determined distance a thinner layer is selected than for a smaller determined distance. This is as a greater determined distance may indicate that a gap which is to be filled is relatively small compared to a smaller determined distance.

The heat sink which may be also referred to as a heat-dissipating device for transferring thermal energy from a higher-temperature surface, e.g., of the upper layer, to a lower-temperature fluid medium. The fluid medium may comprise air, water, refrigerants and/or oil. If the fluid medium comprises water, the heat sink may be also referred to as a cold plate.

The method has several advantages, wherein two of them are described in further detail. First, by selecting the layer thickness of the upper layer based on the determined distance it is possible to precisely adapt the layer thickness of the upper layer with regards to tolerances of the electronic control unit. Thus, a predictable and/or increased cooling performance can be achieved. A tolerance of a height of the electric component on the printed circuit board and/or of a thickness of the integrated heat spreader may be taken into consideration when selecting the layer thickness of the upper layer. Second, by selecting the layer thickness of the upper layer based on the determined distance manufacturing may be simplified. This is as the layer thickness of the upper layer may be selected from commercially available layers of thermal interface material. Hence, an individual manufacturing of an integrated heat spreader can be avoided. Only a punching in the required shape from a commercially available layer may be required. It is understood that these advantages may also apply for the following.

The method may further comprise the step of attaching a housing on the printed circuit board, wherein the housing comprises a through hole which is configured to receive the integrated heat spreader at least partially, wherein the step is optionally performed prior to the step of arranging the integrated heat spreader on top of the lower layer. Using the through hole the integrated heat spreader may be hold in position by the housing. Hence, assembly may be facilitated. Moreover, the housing may provide for an additional heat transfer. It is understood that the step of attaching the housing on the printed circuit board may not necessarily be performed directly prior to the step of arranging the integrated heat spreader on top of the lower layer.

Determining the distance of the top surface of the integrated heat spreader relative to the printed circuit board may comprise measuring a height difference between a top surface of the housing and the top surface of the integrated heat spreader. This allows to adapt the layer thickness of the upper layer with regards to tolerances of the electronic control unit even more precisely. This is as the height difference between the top surface of the housing on which the heat sink is arranged, and the top surface of the integrated heat spreader represents the dimension of the gap which must be filled by the upper layer. Accordingly, tolerances which may result from attaching the printed circuit board to the housing may be taken into consideration. It is to be noted that on top of the housing a layer of thermal interface material may be attached. Hence, the top surface of the housing may be a surface of the thermal interface material attached to the housing.

The upper layer may comprise a thermally conductive compressible material and/or a compressible material with a thermally conductive wrapping layer, wherein the wrapping layer optionally comprises a graphite layer, wherein further optionally the graphite layer has a thickness which lies in a range from 10 μm to 40 μm and even further optionally from 20 μm to 30 μm. The thermally conductive compressible material and/or the compressible material may comprise a foam. Particularly the option of the compressible material with the thermally conductive wrapping layer has proven to be advantageous as it allows for compensating the tolerances in the observed ranges and at the same time provides substantially constant heat transfer properties.

The layer thickness of the upper layer may lie in a range from 0.1 mm to 10 mm, optionally from 0.2 mm to 5 mm, further optionally from 0.4 mm to 1.8 mm, and even further optionally from 1 mm to 1.2 mm. These layer thicknesses allow reliable gap filling and tolerance compensation for most applications, while avoiding excessive pressure on the electric component.

A ratio of the layer thickness of the upper layer to a layer thickness of the lower layer may lie in a range from 1 to 60, optionally from 1.5 to 20, further optionally from 1.8 to 10, even further optionally from 2 to 7, and even more optionally from 3 to 5. These ratios have proven to be advantageous in that they allow for a good heat transfer especially with the above-mentioned layer thicknesses.

The above object is also achieved by a method for manufacturing multiple electronic control units. The method comprises the step of repeating the method steps of the above-described method multiple times for manufacturing multiple electronic control units, wherein each time an integrated heat spreader with the same thickness is arranged. This method particularly allows that an individual manufacturing of integrated heat spreaders is avoided. Rather, only a punching in the required shape from a commercially available layer of thermal interface material is necessary to provide the upper layer in the required thickness.

Optionally, in the above-described methods, a first material with a thermal conductivity K1 is selected for the upper layer if a distance d1 of the top surface of the integrated heat spreader perpendicular to the printed circuit board is determined, wherein a second material with a thermal conductivity K2 which is higher than the thermal conductivity K1 is selected for the upper layer if a distance d2 of the top surface of the integrated heat spreader perpendicular to the printed circuit board is determined, wherein the distance d2 is larger than the distance d1. This allows that larger gaps can be better bridged thermally, and smaller gaps can be fitted with a less complex and therefore less expensive material. It is understood that vice versa a lower thermal conductivity will be selected for the second material in case the distance d2 is shorter.

Further, the above-mentioned object is achieved by an electronic control unit. Since the above-described methods also refer to an electronic control unit, it is understood that the advantages and/or technical aspects which are described with regards to the methods may also apply for the electronic control unit described below and vice versa.

The electronic control unit comprises a printed circuit board with a first and a second electric component attached thereon. The first and/or the second electric component may be configured as the electric component as described above regarding the method. Hence, they may each comprise an integrated circuit. The skilled person will understand that the printed circuit board may comprise a variety of further electric components.

Further, the electronic control unit comprises a heat sink with a contact surface facing the printed circuit board. It is understood that the heat sink may be configured as described above regarding the method.

Moreover, the electronic control unit comprises a first integrated heat spreader arranged between the first electric component and the heat sink, and a second integrated heat spreader arranged between the second electric component and the heat sink, wherein the first integrated heat spreader has substantially the same thickness as the second integrated heat spreader. By the first integrated heat spreader having substantially the same thickness as the second integrated heat spreader manufacturing may be facilitated compared to a solution where integrated heat spreaders are provided with individual thicknesses to compensate for tolerances within the ECU.

Furthermore, the electronic control unit comprises a first lower layer of thermal interface material arranged between the first electric component and the first integrated heat spreader, and a second lower layer of thermal interface material arranged between the second electric component and the second integrated heat spreader.

Even further, the electronic control unit comprises a first upper layer of thermal interface material arranged between the first integrated heat spreader and the heat sink, and a second upper layer of thermal interface material arranged between the second integrated heat spreader and the heat sink.

The first electric component is less high than the second electric component when measured from the printed circuit board, and the first lower layer is thicker than the second lower layer and/or the first upper layer is thicker than the second upper layer. The first electric component may be less high than the second electric component due to manufacturing tolerances and/or due to a difference of the electric components.

Further, the first lower layer may have substantially the same thickness as the second lower layer and the first upper layer may be thicker than the second upper layer. Hence, the first upper layer and/or the second upper layer compensate for the first electric component being less high than the second electric component. Thereby a precise compensation of tolerances is possible particularly when compared to the first particular prior art solution.

Moreover, the electronic control unit may further comprise a housing attached to the printed circuit board, wherein the housing comprises a first opening in which the first integrated heat spreader is at least partially arranged and a second opening in which the second integrated heat spreader is at least partially arranged. The advantages and/or technical aspects which are described with regards to the methods apply here.

The first and/or the second upper layer may comprise a thermally conductive and compressible material and/or a compressible material with a thermally conductive wrapping layer, wherein the wrapping layer optionally comprises a graphite layer, wherein further optionally the graphite layer has a thickness which lies in a range from 10 μm to 40 μm and even further optionally from 20 μm to 30 μm. The advantages and/or technical aspects which are described with regards to the methods apply here.

The first upper layer may comprise a first material and the second upper layer may comprise a second material, wherein the thermal conductivity of the first material is different from the thermal conductivity of the second material, wherein optionally the thermal conductivity of the first material is higher than the thermal conductivity of the second material. This allows that larger gaps can be better bridged thermally, and smaller gaps can be fitted with a less complex and therefore less expensive material.

The integrated heat spreader, the first integrated heat spreader, and/or the second integrated heat spreader may comprise aluminum, copper, ceramics, metal oxide, graphite, gold, silver and/or combinations thereof, wherein optionally the integrated heat spreader, the first integrated heat spreader, and/or the second integrated heat spreader comprise a cylindrical shape or a rectangular cuboid shape. These materials allow for a sufficient heat transfer while the mentioned shapes allow for a facilitated manufacturing and/or assembly.

The heat sink may be configured for passive and/or active heat exchange, wherein optionally the heat sink is configured for a solid, a gaseous and/or a fluid heat exchange medium.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

In the drawings, reference numbers may be reused to identify similar and/or identical elements.

DETAILED DESCRIPTION

Figure 1:
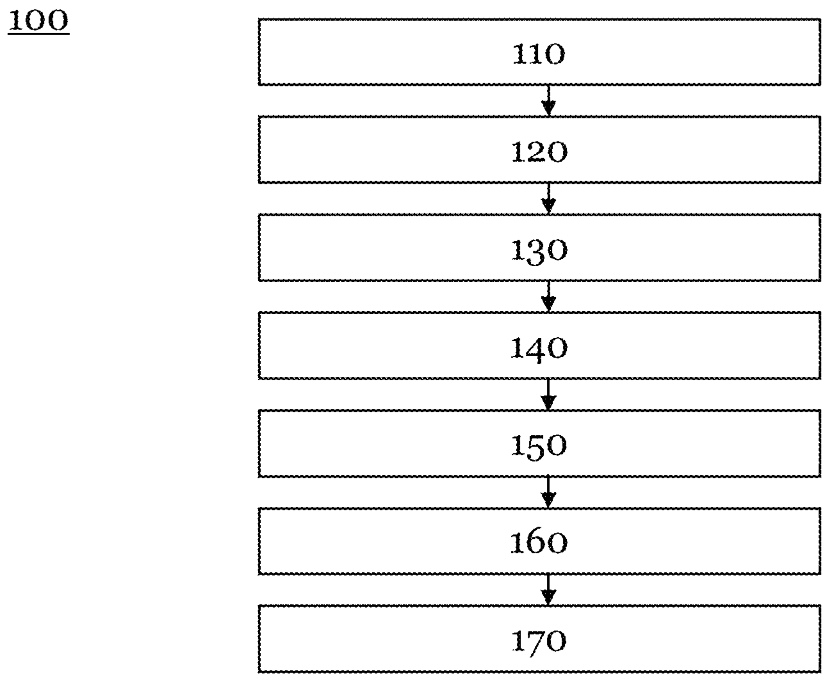
FIG. 1 shows a diagram of a method for manufacturing an electronic control unit according to the present invention.

FIG. 1 shows a diagram of a method 100 for manufacturing an electronic control unit 1; 2. The method 100 comprising the following steps in the given order:

Providing 110 a printed circuit board 10 with at least one electric component 12, 14 attached thereon.

Arranging 120 a lower layer 20, 30 of thermal interface material on top of the electric component 12, 14.

Attaching 130 a housing 90 on the printed circuit board 10, wherein the housing 90 comprises a through hole 92, 94 which is configured to receive the integrated heat spreader 40, 50 at least partially.

Arranging 140 an integrated heat spreader 40, 50 on top of the lower layer 20, 30 and inside the through hole 92, 94.

Determining 150 the distance of the top surface 41, 51 of the integrated heat spreader 40, 50 perpendicular to the printed circuit board 10. Determining the distance of the top surface 41, 51 of the integrated heat spreader 40, 50 relative to the printed circuit board 10 comprises measuring a height difference between a top surface 91 of the housing 90 and the top surface 41, 51 of the integrated heat spreader 40, 50.

Arranging 160 an upper layer 60, 70 of thermal interface material on the top surface 41, 51 of the integrated heat spreader 40, 50, wherein a layer thickness of the upper layer 60, 70 is selected based on the determined distance.

Arranging 170 a heat sink 80 with a contact surface 81 such that the contact surface 81 contacts the upper layer 60, 70.

Figure 2:
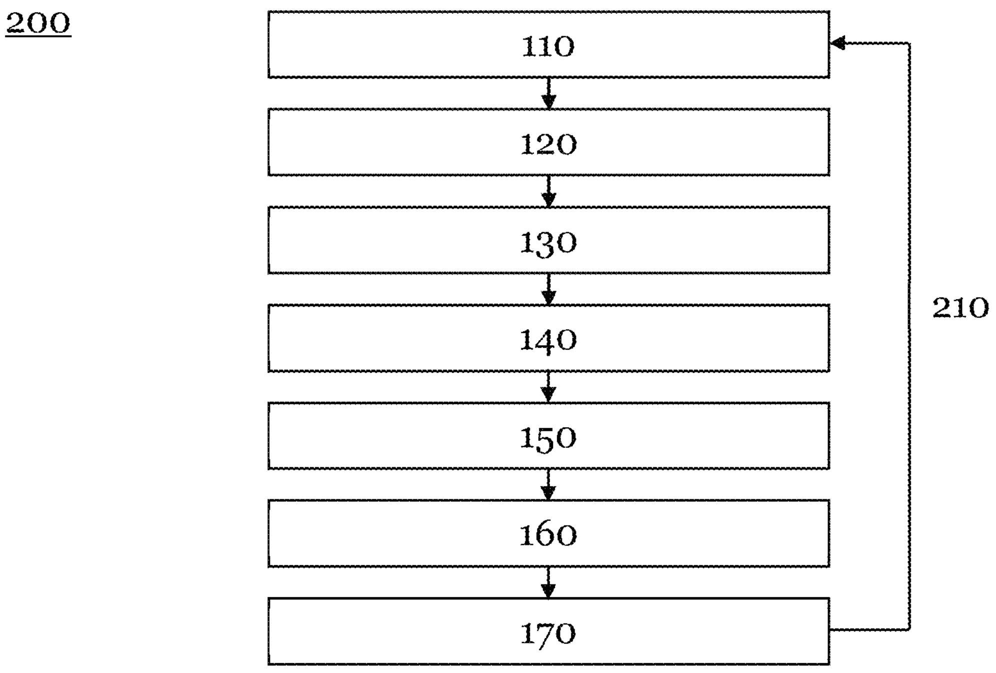
FIG. 2 shows a diagram of a method for manufacturing multiple electronic control units.

FIG. 2 shows a diagram of a method 200 for manufacturing multiple electronic control units, wherein the method 200 comprises the step of repeating 210 the method steps of the method 100.

Figure 3A:
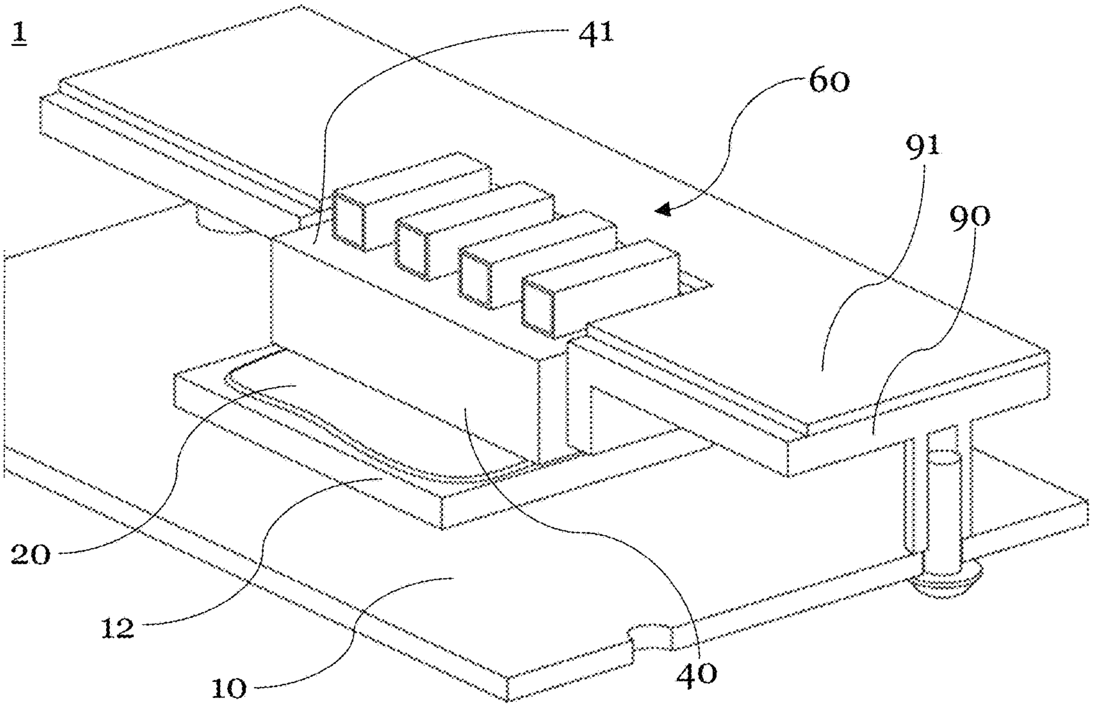
FIGS. 3*a* and 3*b* partially illustrate the method for manufacturing an electronic control unit using a respective electronic control unit in perspective view.
Figure 3B:
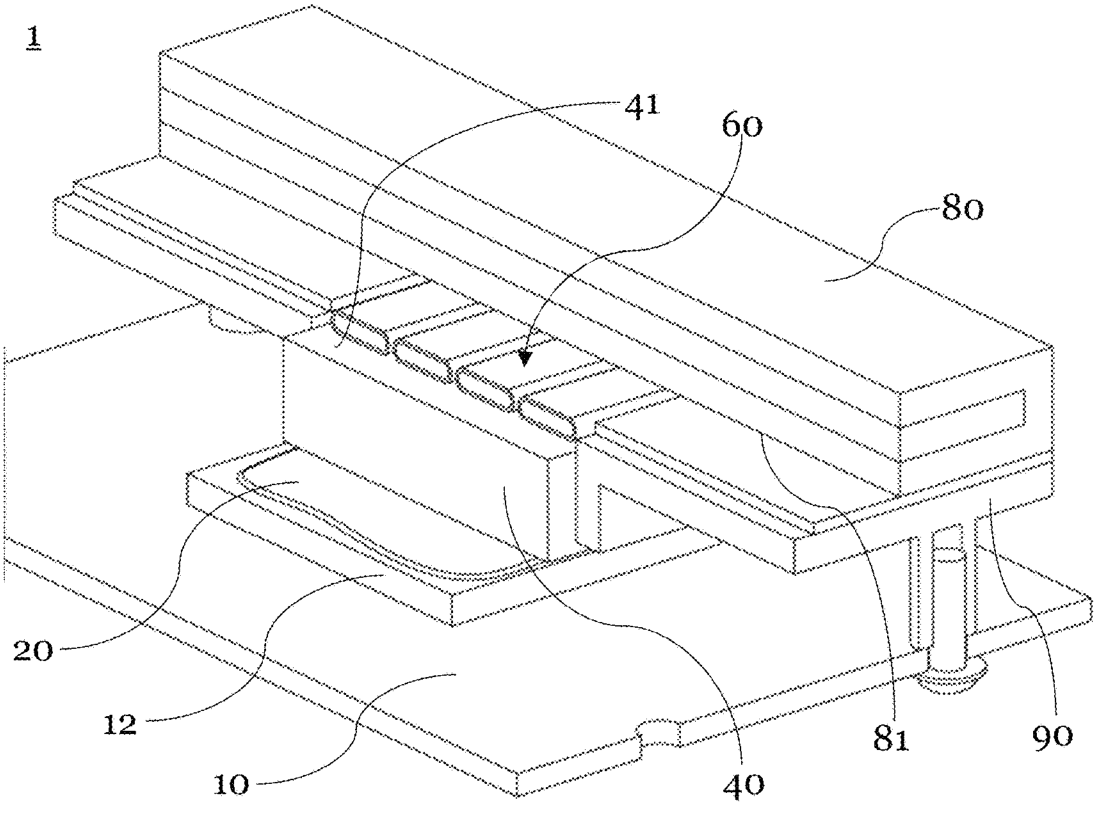
Figure 4A:
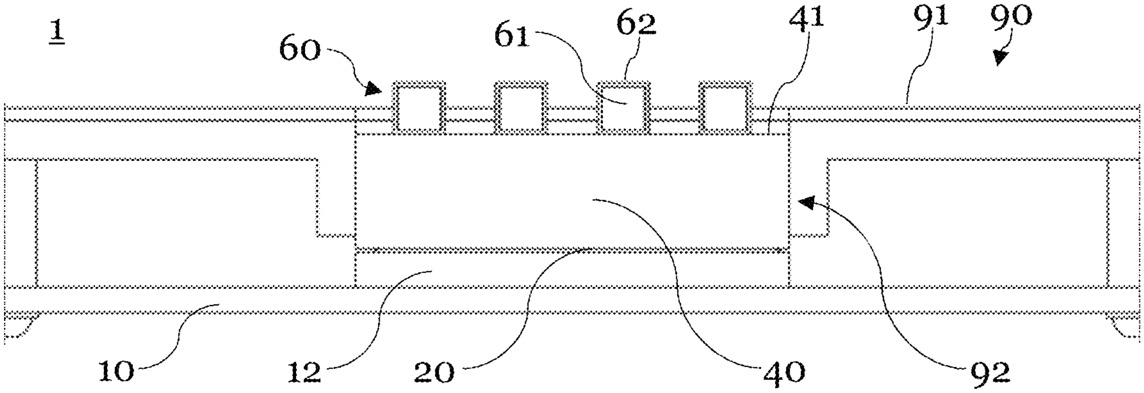
FIGS. 4*a* and 4*b* illustrate the subject-matter of FIGS. 3*a* and 3*b* in a side cut view.
Figure 4B:
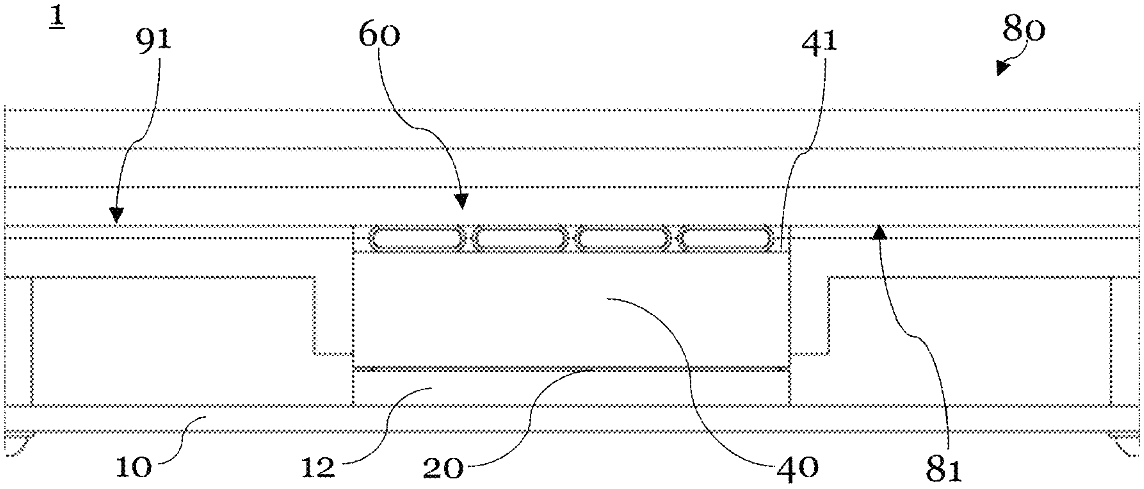

FIG. 3*a* and FIG. 4*a* illustrate the electronic control unit 1 before the heat sink 80 has been arranged, wherein FIG. 3*b* and FIG. 4*b* illustrate the electronic control unit 1 after the heat sink 80 has been arranged. As shown, the upper layer 60 is compressed after the heat sink is arranged on the top surface 91 of the housing 90. The upper layer 60 comprises several elements of compressible material 61 with a thermally conductive wrapping layer 62. Due to the compression the contact surface between the heat spreader 40 and the upper layer 60 increases.

Figure 5A:
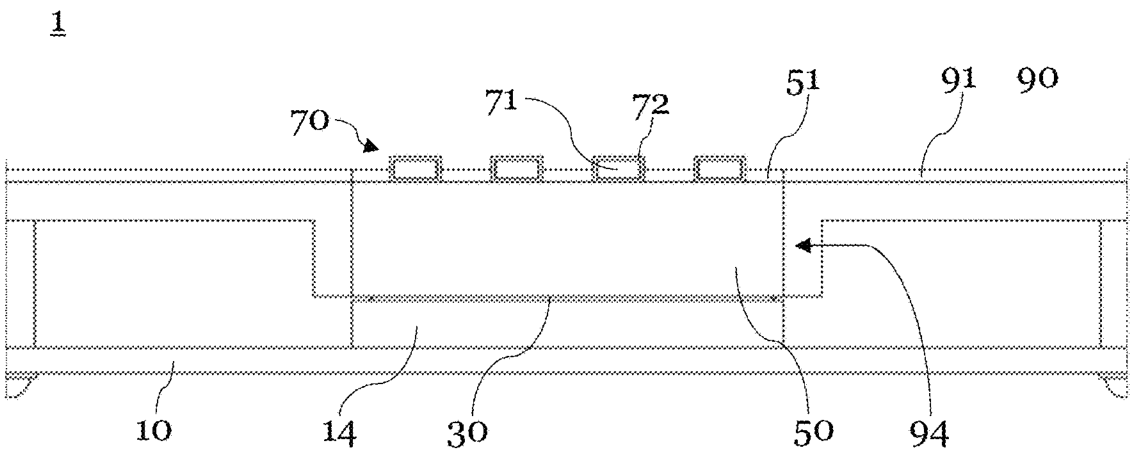
FIGS. 5*a* and 5*b* correspond to FIGS. 4*a* and 4*b*, wherein the electric component is higher relative to the printed circuit board.
Figure 5B:
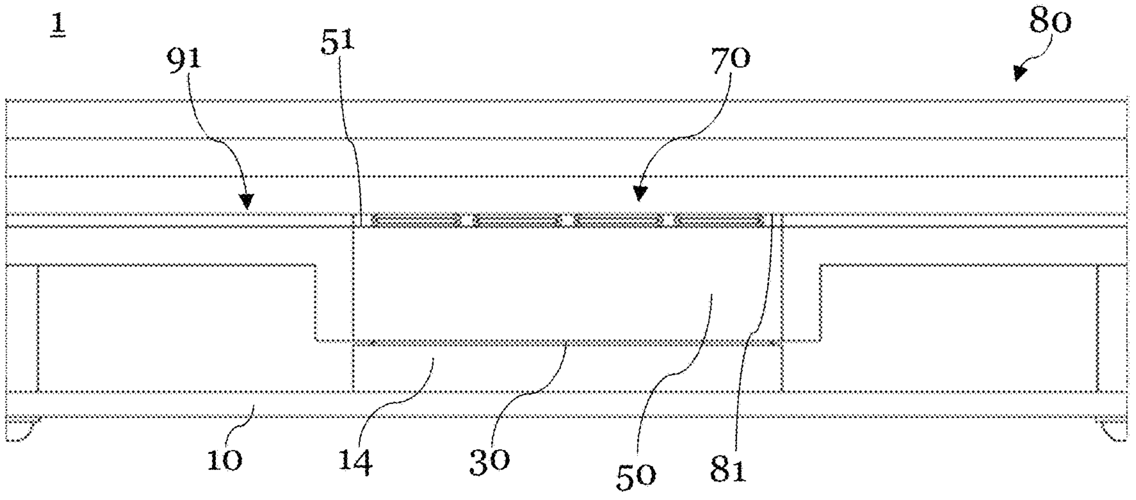

FIGS. 5*a* and 5*b* in comparison to FIGS. 4*a* and 4*b* particularly illustrate that the layer thickness of the upper layer 60, 70 is selected based on the determined distance of the top surface 41, 51 of the integrated heat spreader 40, 50 perpendicular to the printed circuit board 10. Moreover, it can be derived that the integrated heat spreaders 40, 50 have the same thickness.

Figure 6:
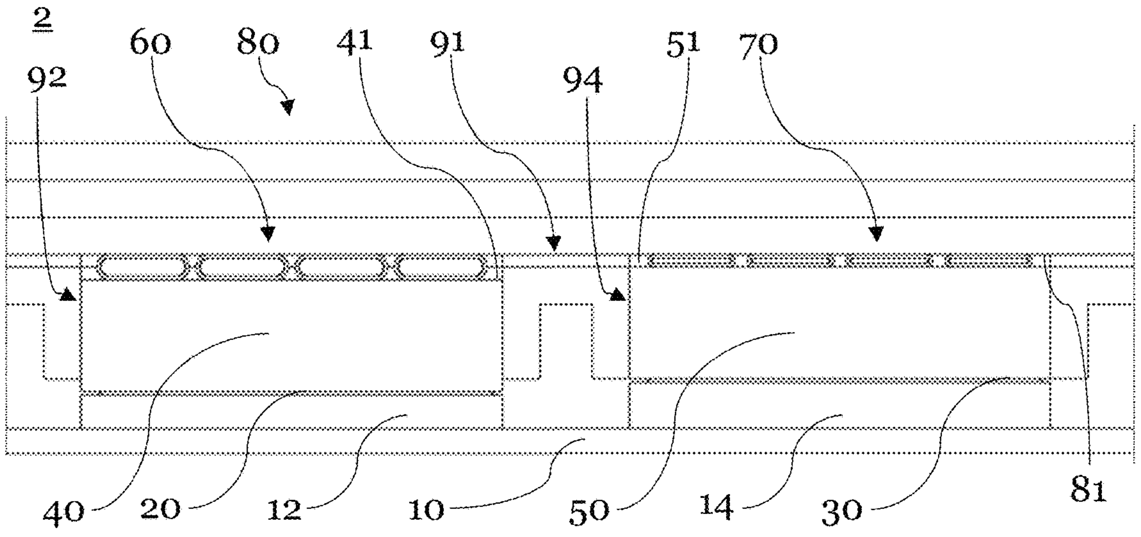
FIG. 6 shows an electronic control unit according to the present invention.

FIG. 6 shows an electronic control unit 2, comprising a printed circuit board 10 with a first 12 and a second 14 electric component attached thereon. Thereby the first electric component 12 is less high than the second electric component 14 when measured from the printed circuit board 10.

The ECU 2 further comprises a heat sink 80 with a contact surface 81 facing the printed circuit board 10. Moreover, the ECU 2 comprises a first integrated heat spreader 40 and a second integrated heat spreader 50 which substantially have the same thickness. Hence, they may be manufactured using exactly the same manufacturing process.

Further, the ECU 2 comprises a first lower layer 20 of thermal interface material, a second lower layer 30 of thermal interface material, a first upper layer 60 of thermal interface material, and a second upper layer 70 of thermal interface material. Thereby the first lower layer 20 has substantially the same thickness as the second lower layer 30 and the first upper layer 60 is thicker than the second upper layer 70.

Moreover, a housing 90 is attached to the printed circuit board 10, wherein the housing 90 comprises a first opening 92 in which the first integrated heat spreader 40 is at least partially arranged and a second opening 94 in which the second integrated heat spreader 50 is at least partially arranged.

The term non-transitory computer-readable medium does not encompass transitory electrical or electromagnetic signals propagating through a medium (such as on a carrier wave). Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The phrase "at least one of A, B, and C" should be construed to mean a logical (A OR B OR C), using a non-exclusive logical OR, and should not be construed to mean "at least one of A, at least one of B, and at least one of C." The phrase "at least one of A, B, or C" should be construed to mean a logical (A OR B OR C), using a non-exclusive logical OR.

LIST OF REFERENCE SIGNS

1; 2 electronic control unit
10 printed circuit board
12, 14 electric component
20, 30 lower layer of thermal interface material
40, 50 integrated heat spreader
41, 51 top surface of the integrated heat spreader
60, 70 upper layer of thermal interface material
61, 71 compressible material
62, 72 thermally conductive wrapping layer
80 heat sink
81 contact surface of the heat sink
90 housing
91 top surface of the housing
92, 94 through hole of the housing
100 method for manufacturing an electronic control unit
110 providing printed circuit board
120 arranging lower layer
130 attaching housing
140 arranging integrated heat spreader
150 determining distance
160 arranging upper layer
170 arranging heat sink
200 method for manufacturing multiple electronic control units
210 repeating method steps of method 100

The invention claimed is:

1. A method for manufacturing an electronic control unit, the method comprising:
providing a printed circuit board with an electric component attached thereon;
arranging a lower layer of thermal interface material on top of the electric component;
arranging an integrated heat spreader on top of the lower layer;
determining a distance of a top surface of the integrated heat spreader perpendicular to the printed circuit board;
arranging an upper layer of thermal interface material on the top surface of the integrated heat spreader, wherein a layer thickness of the upper layer is selected based on the determined distance; and arranging a heat sink with a contact surface such that the contact surface contacts the upper layer.

2. A method for manufacturing multiple electronic control units, the method comprising:

repeating the method of claim 1 to manufacture each of the multiple electronic control units, wherein a same thickness is used for the respective integrated heat spreader of each of the multiple electronic control units.

3. The method of claim 1 further comprising:

attaching a housing on the printed circuit board, wherein the housing includes a through hole that is configured to receive the integrated heat spreader at least partially.

4. The method of claim 3 wherein attaching the housing is performed prior to arranging the integrated heat spreader on top of the lower layer.

5. The method of claim 3 wherein determining the distance of the top surface of the integrated heat spreader relative to the printed circuit board includes measuring a height difference between a top surface of the housing and the top surface of the integrated heat spreader.

6. The method of claim 1 wherein the upper layer includes at least one of:

a thermally conductive compressible material; or a compressible material with a wrapping layer that is thermally conductive.

7. The method of claim 6 wherein:

the upper layer includes the compressible material with the wrapping layer; and the wrapping layer includes a graphite layer.

8. The method of claim 7 wherein the graphite layer has a thickness in a range from 10 μm to 40 μm.

9. The method of claim 1 wherein the layer thickness of the upper layer is in a range from 0.1 mm to 10 mm.

10. The method of claim 1 wherein a ratio of the layer thickness of the upper layer to a layer thickness of the lower layer is in a range from 1 to 60.

11. The method of claim 1 further comprising:

selecting a first material with a thermal conductivity K1 for the upper layer in response to the determined distance being a first value d1; and selecting a second material with a thermal conductivity K2 for the upper layer in response to the determined distance being a second value d2, wherein:

the thermal conductivity K2 is higher than the thermal conductivity K1, and the second value d2 is larger than the first value d1.

* * * * *